United States Patent
Chen et al.

(10) Patent No.: US 9,138,840 B2
(45) Date of Patent: Sep. 22, 2015

(54) METHOD FOR MANUFACTURING A HEAT SINK

(71) Applicants: Qiao-Long Chen, Foshan (CN); Meng Fu, Foshan (CN); Zi-Fu Yang, Foshan (CN); Chun-Chi Chen, New Taipei (TW)

(72) Inventors: Qiao-Long Chen, Foshan (CN); Meng Fu, Foshan (CN); Zi-Fu Yang, Foshan (CN); Chun-Chi Chen, New Taipei (TW)

(73) Assignees: CHAMP TECH OPTICAL (FOSHAN) CORPORATION, Foshan (CN); Foxconn Technology Co., Ltd., New Taipei (TW)

( * ) Notice: Subject to any disclaimer, the term of this patent is extended or adjusted under 35 U.S.C. 154(b) by 357 days.

(21) Appl. No.: 13/650,499

(22) Filed: Oct. 12, 2012

(65) Prior Publication Data
US 2013/0240190 A1 Sep. 19, 2013

(30) Foreign Application Priority Data
Mar. 13, 2012 (CN) .............................. 201210064824

(51) Int. Cl.
| | |
|---|---|
| *B23P 15/26* | (2006.01) |
| *B23P 11/00* | (2006.01) |
| *H01L 23/367* | (2006.01) |
| *H01L 21/48* | (2006.01) |
| *F28F 3/04* | (2006.01) |
| *F28F 3/06* | (2006.01) |

(52) U.S. Cl.
CPC ................. *B23P 15/26* (2013.01); *B23P 11/00* (2013.01); *F28F 3/048* (2013.01); *F28F 3/06* (2013.01); *H01L 21/4878* (2013.01); *H01L 23/3672* (2013.01); *B23P 2700/10* (2013.01); *F28F 2275/122* (2013.01); *H01L 2924/0002* (2013.01); *Y10T 29/49908* (2015.01)

(58) Field of Classification Search
CPC ...... B23P 15/26; B23P 11/00; B23P 2700/10; F28F 3/048; F28F 3/06; F28F 2275/122; H01L 23/3672; H01L 21/4878; H01L 2924/0002; Y10T 29/49908; B21D 53/02; B21D 53/022; B21D 53/025
See application file for complete search history.

(56) References Cited

U.S. PATENT DOCUMENTS

| | | | | |
|---|---|---|---|---|
| 8,413,713 | B2* | 4/2013 | Huang | 165/80.3 |
| 8,555,952 | B2* | 10/2013 | Huang | 165/80.3 |
| 2005/0000682 | A1* | 1/2005 | Chien et al. | 165/80.3 |
| 2005/0150633 | A1* | 7/2005 | Lee et al. | 165/80.3 |
| 2007/0029068 | A1* | 2/2007 | Cheng et al. | 165/80.3 |
| 2008/0060793 | A1* | 3/2008 | Huang | 165/104.33 |
| 2009/0050308 | A1* | 2/2009 | Kuo | 165/185 |
| 2009/0194255 | A1* | 8/2009 | Huang | 165/80.3 |

* cited by examiner

*Primary Examiner* — Sarang Afzali
(74) *Attorney, Agent, or Firm* — Novak Druce Connolly Bove + Quigg LLP

(57) ABSTRACT

An exemplary method for manufacturing a heat sink includes steps: providing a base with a plurality of spaced protrusions formed thereon; providing a plurality of fins and bending a distal end of each fin to form a connecting end; fitting each fin between two adjacent protrusions correspondingly and attaching the connecting end of each fin to the base; and deforming each protrusion to press the connecting ends of two adjacent fins.

7 Claims, 6 Drawing Sheets

```
┌─────────────────────────────────────────────────┐
│ Providing a base with a plurality of spaced     │
│ protrusions formed thereon                      │
└─────────────────────────────────────────────────┘
                         │
                         ▼
┌─────────────────────────────────────────────────┐
│ Providing a plurality of fins and bending a distal │
│ end of each fin to form a connecting end        │
└─────────────────────────────────────────────────┘
                         │
                         ▼
┌─────────────────────────────────────────────────┐
│ Fitting each fin between two adjacent protrusions │
│ correspondingly and attaching the connecting end │
│ of each fin to the base                         │
└─────────────────────────────────────────────────┘
                         │
                         ▼
┌─────────────────────────────────────────────────┐
│ Deforming each protrusion to press the          │
│ connecting ends of two adjacent fins            │
└─────────────────────────────────────────────────┘
```

FIG. 1

METHOD FOR MANUFACTURING A HEAT SINK

BACKGROUND

1. Technical Field

The disclosure generally relates to heat dissipations, and more particularly to a heat sink including a base and a plurality of fins combined together and a method for manufacturing the heat sink.

2. Description of Related Art

Heat sinks are used for removing heat from heat-generating electronic components such as central processing units (CPUs) and others. Thereby, heat sinks keep electronic components within safe operation, and enable the electronic components to operate steadily. A typical heat sink includes a base contacting an electronic component and absorbing heat therefrom, and a plurality of parallel planar fins attached to the base by soldering. The fins dissipate the heat to the ambient environment.

When the above-described heat sink is manufactured, soldering flux needs to be added between the fins and the base for convenient soldering. Specially, when the fins and the base are made of different materials, a prior process of nickel-plating may be required before the fins and the base are soldered together. Such process materials and manufacturing procedures make the assembly of the fins and the base costly and complicated.

What is desired, therefore, is a heat sink and a method for manufacturing the heat sink which can overcome the above described shortcomings.

BRIEF DESCRIPTION OF THE DRAWINGS

FIG. 1 is a flow chart of a method for manufacturing a heat sink in accordance with an exemplary embodiment of the present disclosure.

DETAILED DESCRIPTION

Reference will now be made to the figures to describe the present heat sink and the method for manufacturing the same in detail.

Referring to FIG. 1, a method for manufacturing a heat sink in accordance with an embodiment of the present disclosure includes steps of:

Step 1: providing a base with a plurality of spaced protrusions formed thereon;

Step 2: providing a plurality of fins and bending a distal end of each fin to form a connecting end;

Step 3: fitting each fin between two adjacent protrusions correspondingly and attaching the connecting end of each fin to the base;

Step 4: deforming each protrusion to press the connecting ends of two adjacent fins.

Figure 2:
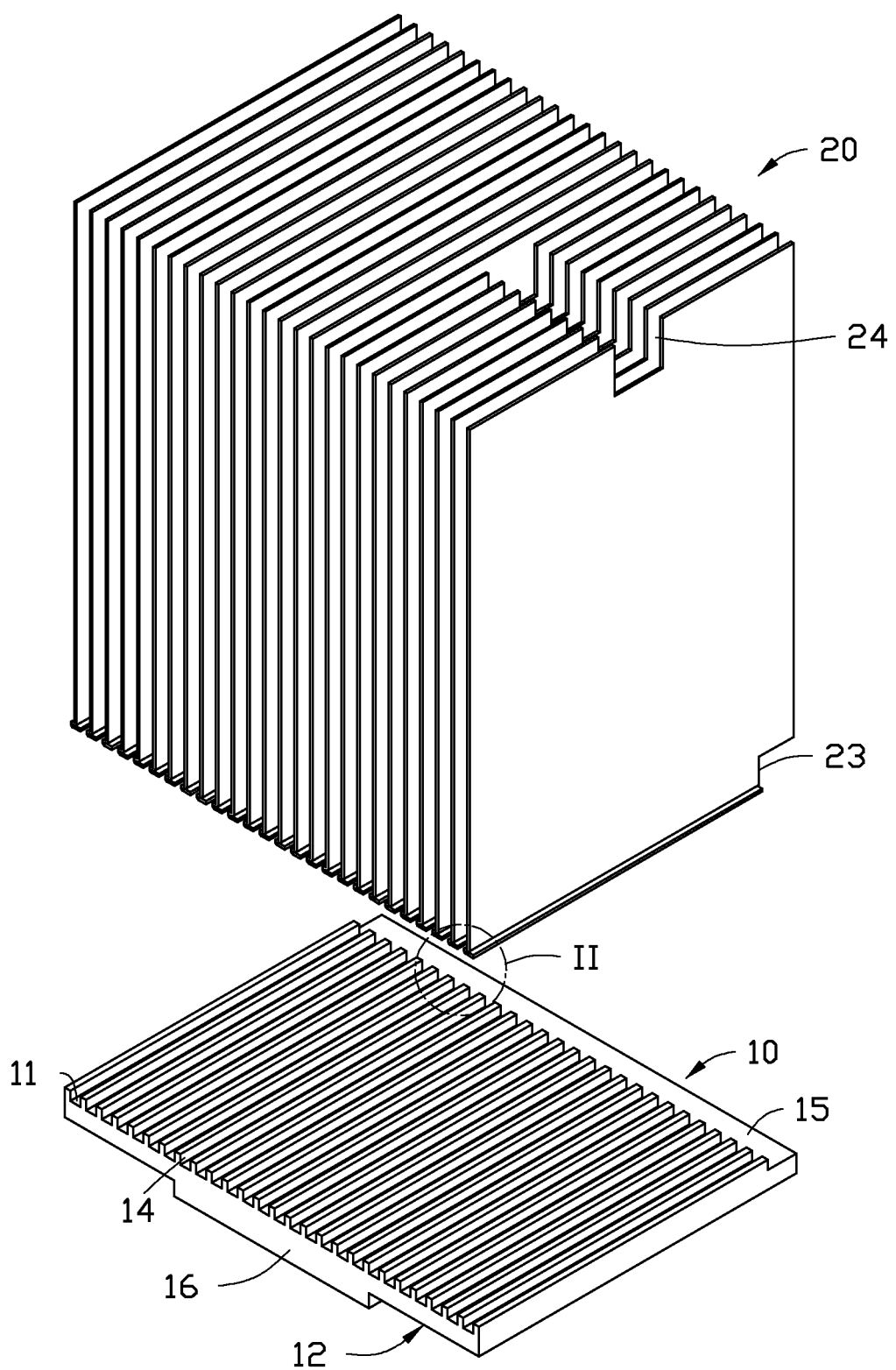
FIG. 2 is a schematic view showing a base and a plurality of fins provided in the method for manufacturing a heat sink of FIG. 1.
Figure 3:
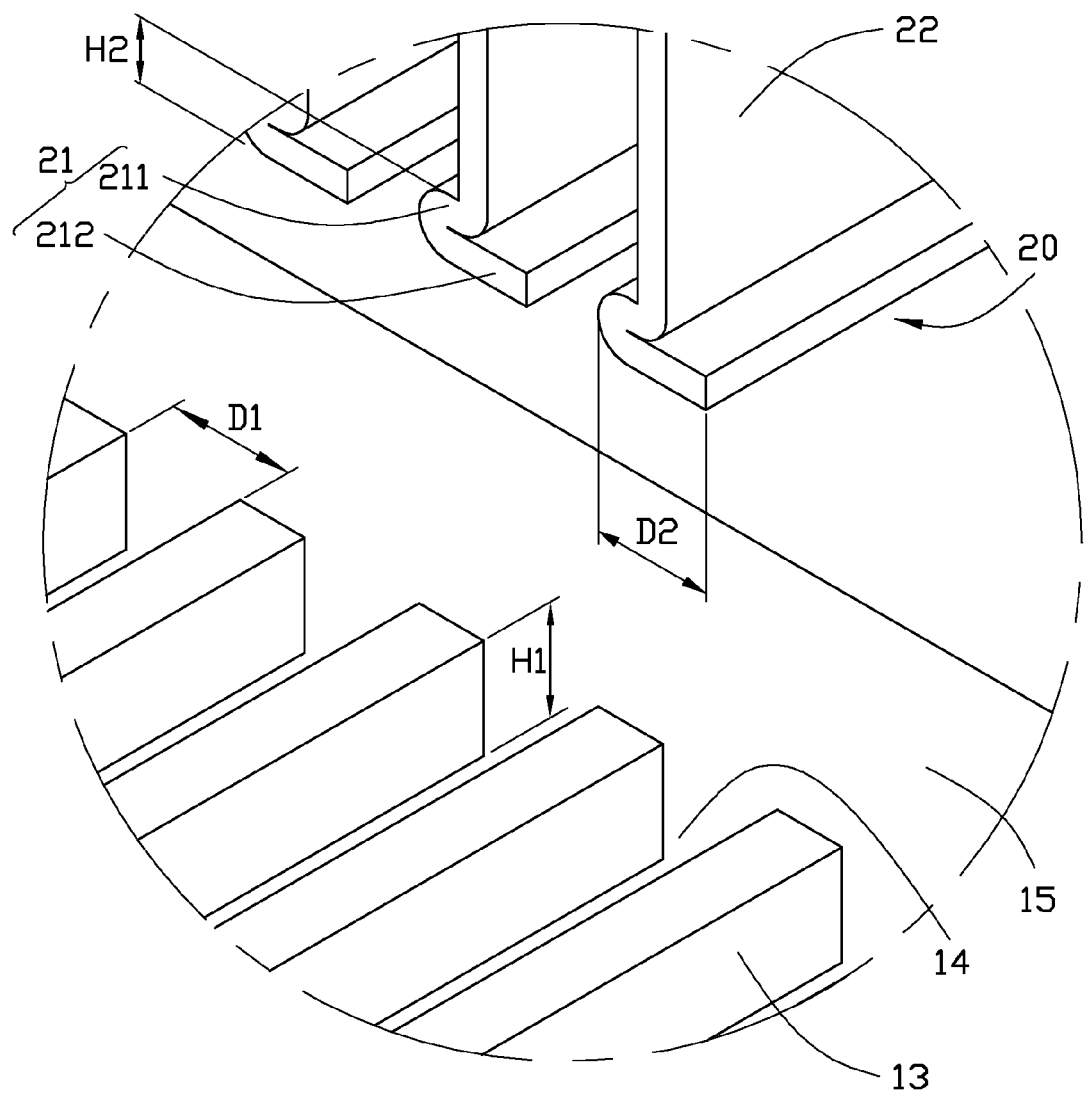
FIG. 3 is an enlarged view of a circled portion II of FIG. 2.

In step 1, referring also to FIGS. 2-3, a base 10 is provided. The base 10 is substantially rectangular, and includes a top surface 11 and a bottom surface 12 away from the top surface 11. A plurality of protrusions 13 extend upwardly from the top surface 11 and longitudinally along a widthwise direction of the base 10. The protrusions 13 are parallel to and spaced from each other. A slot 14 is defined between each two adjacent protrusions 13. A width D1 of the slot 14 is equal to a distance between two adjacent protrusions 13. Each protrusion 13 has a height H1. A length of the protrusion 13 along the longitudinal direction thereof can be changed according to actual requirement. In this embodiment, the length of the protrusion 13 is smaller than a width of the base 10. A planar area 15 is remained on the top surface 11 adjacent to same distal ends of the protrusions 13 and a lateral side of the base 10, for other utilizations. The bottom surface 12 is configured to contact a heat-generating component (not illustrated) to absorb heat therefrom. Furthermore, a projection 16 extends from the bottom surface 12, away from the top surface 11 of the base 10. An end surface of the projection 16 is configured to be smooth to obtain a good thermal contact between the base 10 and the heat-generating component.

The protrusions 13 can be made by punching or milling. In the punching process, the protrusions 13 can be formed by punching the top surface 11 of the base 10 with molds. In the milling process, the slots 14 are milled on the top surface 11 of the base 10, and a protruding portion between each two neighboring slots 14 is designated as the protrusion 13.

In step 2, a plurality of fins 20 are provided. Each of the fins 20 is a substantially rectangular thin metallic plate. The fins 20 are parallel to each other. Each of the fins 20 includes a substantially rectangular main body 22 and a connecting end 21 bent perpendicularly from the main body 22. The connecting end 21 is bent twice and includes a first bend section 211 and a second bend section 212. The first bend section 211 and the second bend section 212 are formed by following steps: a lower part of each fin 20 is bent 90 degrees towards a lateral side of the fin 20 firstly to form the first bend section 211 perpendicular to the main body 22, and then a distal end of the first bend section 211 of each fin 20 is bent 180 degrees towards an opposite lateral side of the fin 20 to form the second bend section 212 perpendicular to the main body 22. A width D2 of the second bend section 212 is greater than that of the first bend section 211. The width D2 of the second bend section 212 is smaller than the width D1 of the slot 14. Thus, the second bend section 212 can be fitted in the slot 14. A sum of thicknesses H2 of the first bend section 211 and the second bend section 212 is smaller than the height H1 of the protrusion 13.

The connecting end 21 is perpendicular to the main body 22 of each fin 20, thereby increasing a contacting area between the connecting end 21 and the base 10, when the fins 20 are assembled to the base 10. When the fins 20 are fixed in the base 10, the fins 20 are perpendicular to the base 10 which enhances a firm connection between the fins 20 and the base 10. In alternative embodiments, the connecting end 21 can also be inclined to the main body 22 of each fin 20 to meet actual requirements. Furthermore, a first gap 23 is defined in part of the connecting ends 21 of the fins 20. A width of the first gap 23 is substantially equal to that of the planar area 15. A second gap 24 is defined in part of the fins 20 away from the connecting ends 21. The first and second gaps 23, 24 are used for matching the heat sink 100 with other components.

Figure 4:
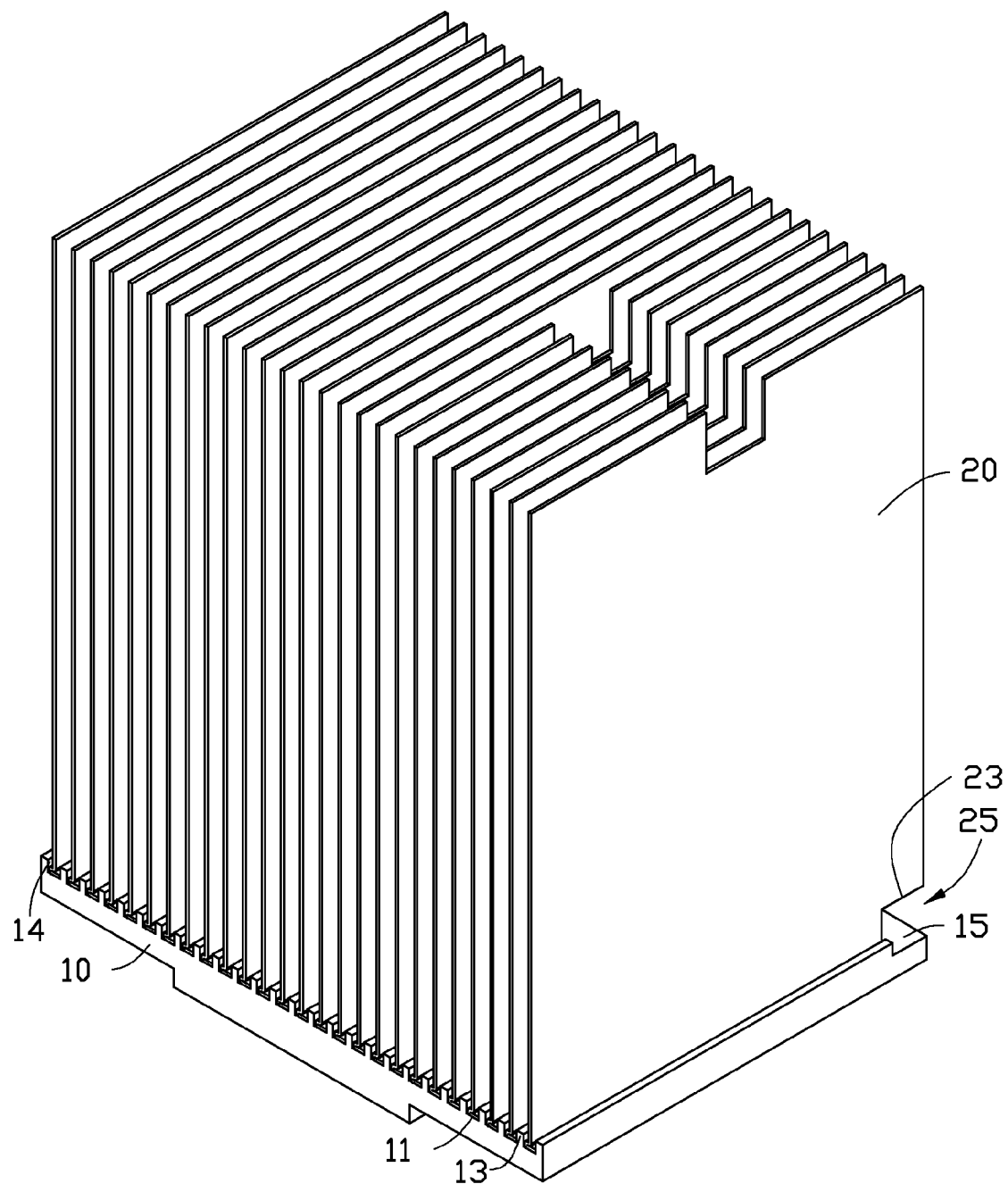
FIG. 4 is a schematic view showing a semi-finished heat sink manufactured by the method of FIG. 1.

In step 3, referring to FIG. 4, each fin 20 is arranged between two adjacent protrusions 13, and the connecting end 21 of each fin 20 is attached to the base 10. The second bend section 212 of each connecting end 21 is fitted in a corresponding slot 14. A bottom surface of the second bend section 212 is attached to the top surface 11 of the base 10 in the corresponding slot 14. Each protrusion 13 protrudes beyond the first bend section 211 of each connecting end 21. The planar area 15 of the base 10 is corresponding to the first gap 23 of the fins to cooperatively define a groove 25 therebetween. The groove 25 is used for matching with other components.

Figure 5:
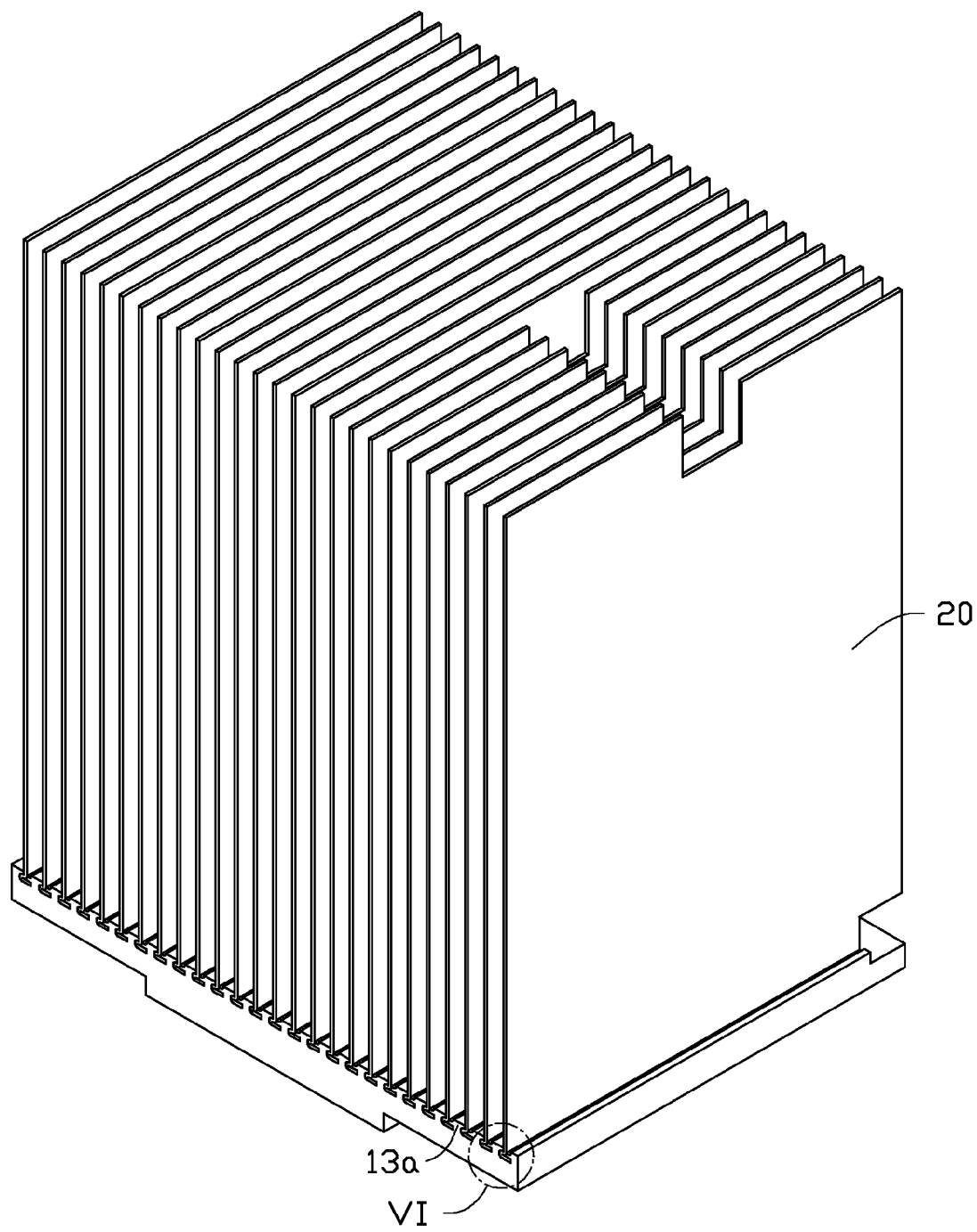
FIG. 5 is a schematic view showing a heat sink manufactured by the method of FIG. 1.
Figure 6:
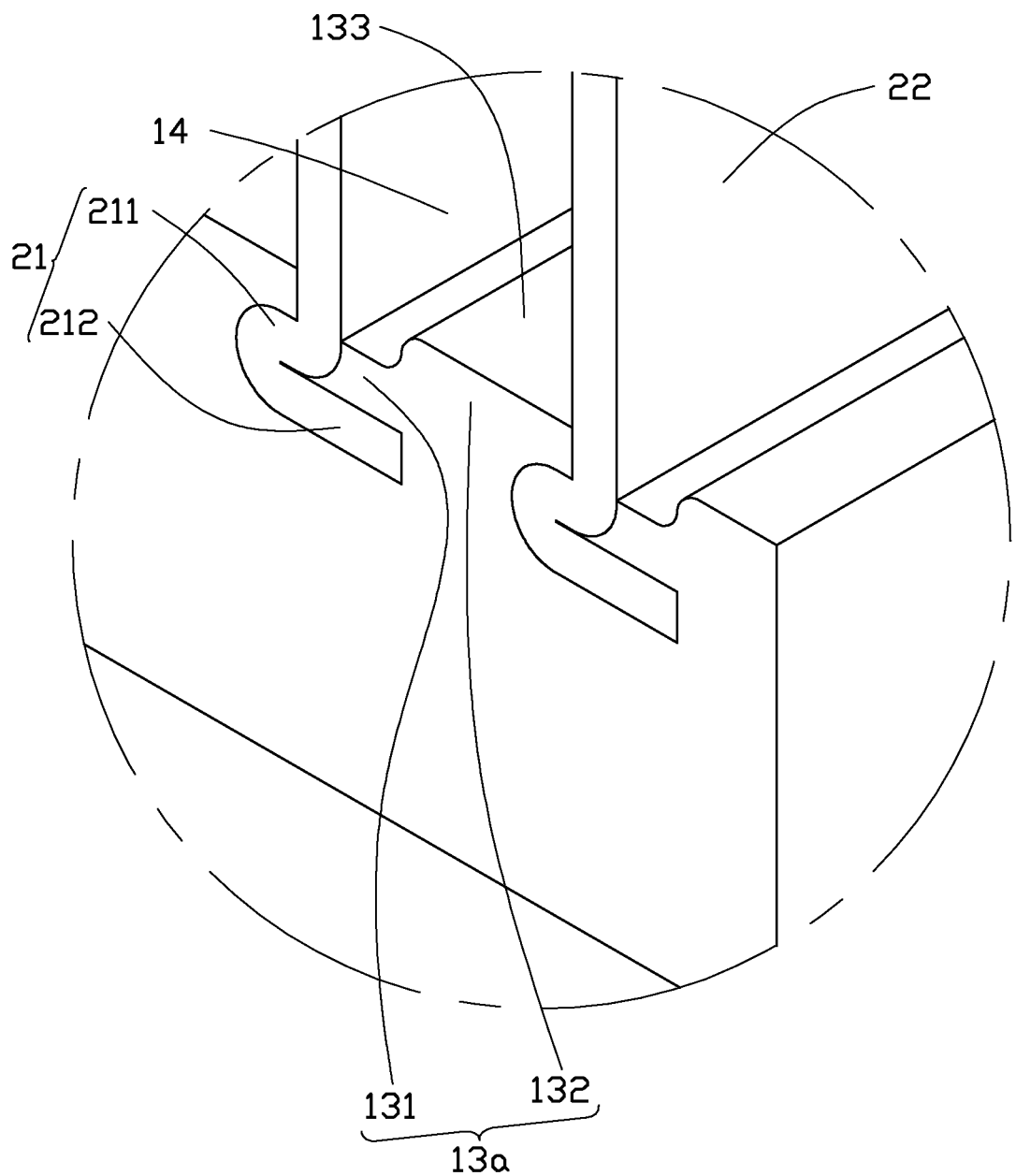
FIG. 6 is an enlarged view of a circled portion VI of the heat sink of FIG. 5.

In step 4, referring to FIG. 5, each protrusion 13 is deformed to press the connecting ends 21 of two adjacent fins 20. In this embodiment, each protrusion 13 can be punched downwardly to deform, thereby forming a block 13a pressing the connecting ends 21 of each two adjacent fins 20. Each block 13a presses the first bend section 211 of one connecting end 21 and the second bend section 212 of an adjacent connecting end 21. An upper surface 133 of the block 13a is substantially step-like. The block 13a includes a first portion 131 as a lower step and a second portion 132 as a higher step. The first portion 131 presses the second bend section 212 of one connecting end 21, and the second portion 132 presses the first bend section 211 of the adjacent connecting end 21, which has a greater thickness than that of the second bend section 212. A height of the block 13a can be adjusted according to the thicknesses of connecting ends 21 to make a thickness of the first portion 131 of the block 13a equal to that of the second portion 132, thereby obtaining a balance force applied to the protrusions 13 and avoiding a bend or breakage of the fins 20 towards a direction suffering a lower force. If the force of the block 13a is big enough, the upper surface 133 of the block 13a can also be configured to be planar. The punching process can be performed once to deform all of the protrusions 13 at the same time, or be performed several times to deform each protrusion 13 respectively.

A heat sink 100 in accordance with an embodiment of the present disclosure is also provided. The heat device 100 includes a base 10 and a plurality of fins 20 combined in the base 10.

A plurality of blocks 13a extend upwardly from the base 10. The blocks 13a are parallel to and spaced from each other. Each of the fins 20 includes a substantially rectangular main body 22, and a connecting end 21 bent perpendicularly from the main body 22. A height of the block 13a is greater than a thickness of the connecting end 21. The connecting end 21 includes a first bend section 211 and a second bend section 212. The first bend section 211 is stacked on the second bend section 212. A width of the second bend section 212 is greater than that of the first bend section 211. The connecting end 21 of each fin 20 is combined to the base 10 by being pressed via the block 13a. In other words, each block 13a presses the connecting ends of two adjacent fins 20. Each block 13a has a step-like surface. The block 13a includes a first portion 131 as a lower step and a second portion 132 as a higher step adjacent to the first portion 131. The first portion 131 presses the second bend section 212 of the connecting end 21 of one fin 20, and the second portion 132 presses the first bend section 211 of another connecting end 21 adjacent to the prior connecting end 21, which has a greater thickness than that of the second bend section 212.

In the present heat sink, soldering flux and nickel plating are not required during assembling of the fins 20 and the base 10. This greatly reduces a manufacturing cost of the heat sink 100, and allows assembly of the fins 20 and the base 12 to be simple and convenient.

It is to be understood, however, that even though numerous characteristics and advantages of the embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A method for manufacturing a heat sink, comprising steps:
   providing a base with a plurality of parallel and spaced apart protrusions formed on a top surface thereon, wherein the plurality of protrusions extend upwardly from the top surface and longitudinally along a widthwise direction of the base defining a slot with a bottom surface between each two adjacent protrusions;
   providing a plurality of fins and bending a distal end of each fin to form a connecting end for each of the plurality of fins;
   fitting each fin in a slot between two adjacent protrusions correspondingly and attaching the connecting end of each fin to the base; and
   deforming each of the plurality of protrusions to downwardly press the connecting ends of two adjacent fins;
   wherein the step of bending the distal end of each fin to form a connecting end comprises steps:
   bending a lower part of each fin towards a lateral side of the fin, to form a first bend section; and
   bending a distal end of the first bend section towards an opposite lateral side of the fin, to form a second bend section;
   wherein each protrusion is punched downwardly to form a block pressing the connecting ends of two adjacent fins correspondingly;
   wherein an upper surface of the block is step-like; and
   wherein the step-like block comprises a first portion having an upper surface at a lower elevation and a second portion having an upper surface at a higher elevation with respect and adjacent to the first portion, the first portion presses the second bend section of one of the connecting ends downward against a bottom surface of a corresponding slot, and the second portion presses the first bend section of an adjacent one of the connecting ends downward against a bottom surface of an adjacent corresponding slot.

2. The method of claim 1, wherein the connecting end is perpendicular to other part of each fin.

3. The method of claim 1, wherein the lower part of each fin is bent 90 degrees, and the distal end of the first bend section is bent 180 degrees.

4. The method of claim 1, wherein the first bend section is stacked on the second bend section, and a width of the first bend section is smaller than that of the second bend section.

5. The method of claim 1, wherein a sum of thicknesses of the first bend section and the second bend section is smaller than a height of each protrusion.

6. The method of claim 1, wherein the protrusions are made by punching, and a distance between each two adjacent protrusions is equal to or greater than a width of the connecting end of each fin.

7. The method of claim 1, wherein the protrusions are made by milling, and a distance between each two adjacent protrusions is equal to or greater than a width of the connecting end of each fin.

* * * * *